(12) United States Patent
Lozhkin

(10) Patent No.: US 9,077,409 B2
(45) Date of Patent: Jul. 7, 2015

(54) SIGNAL PROCESSING SYSTEM AND SIGNAL PROCESSING METHOD

(71) Applicant: FUJITSU LIMITED, Kawasaki-shi, Kanagawa (JP)

(72) Inventor: Alexander Nikolaevich Lozhkin, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 146 days.

(21) Appl. No.: 13/721,695

(22) Filed: Dec. 20, 2012

(65) Prior Publication Data

US 2013/0195221 A1 Aug. 1, 2013

(30) Foreign Application Priority Data

Jan. 31, 2012 (JP) ................................. 2012-019263

(51) Int. Cl.
*H04K 1/02* (2006.01)
*H04L 25/03* (2006.01)
*H04L 25/49* (2006.01)
*H04B 1/04* (2006.01)
*H04L 27/26* (2006.01)
*H04L 27/36* (2006.01)
*H03F 1/32* (2006.01)
*H03F 3/189* (2006.01)
*H03F 3/24* (2006.01)

(52) U.S. Cl.
CPC .......... *H04B 1/0475* (2013.01); *H04L 27/2614* (2013.01); *H04L 27/2624* (2013.01); *H04L 27/368* (2013.01); *H03F 1/3247* (2013.01); *H03F 1/3258* (2013.01); *H03F 3/189* (2013.01); *H03F 3/245* (2013.01); *H03F 2201/3224* (2013.01)

(58) Field of Classification Search
None
See application file for complete search history.

(56) References Cited

U.S. PATENT DOCUMENTS

2005/0157814 A1* 7/2005 Cova et al. .................... 375/297
2011/0092173 A1* 4/2011 McCallister et al. ......... 455/108

OTHER PUBLICATIONS

J. Armstrong, "New OFDM peak-to-average power reduction scheme," in Proceedings of IEEE on Vehicular Technology,(IEEE, 2001), pp. 756-760.
Lei Ding et al., "A Robust Digital Baseband Predistorter Constructed Using Memory Polynomials," IEEE Transaction on Communications, vol. 52, No. 1, Jan. 2004.
R. Marsalek,P. Jardin, and G. Baudoin, "From Post-Distortion to Pre-Distortion for Power Amplifiers Linearization," IEEE Communications Letters, vol. 7, No. 7, Jul. 2003.

* cited by examiner

*Primary Examiner* — Chieh M Fan
*Assistant Examiner* — Wednel Cadeau
(74) *Attorney, Agent, or Firm* — Katten Muchin Rosenman LLP

(57) ABSTRACT

A signal processing system is provided. The signal processing system includes: a peak-to-average ratio (PAPR) reducer that reduces a peak-to-average ratio (PAPR) of an input signal x(n), a clipping noise processing system that generates an equivalent clipping noise signal $\epsilon^*_{CL}(n)$ that is defined as a weighted sum of a weighted in-band clipping signal $W_{IN}{}^*\epsilon_{CL,IN}(n)$ and a weighted out-of-band clipping signal $W_{OUT}{}^*\epsilon_{CL,OUT}(n)$ to be used for determining functions of a predistorter that suppresses out-of-band spectrum caused during peak-to-average power reduction process and for generating an input signal of an amplifier which input signal has reduced clipping noise and be distorted so as to compensate nonlinearity of the amplifier.

8 Claims, 11 Drawing Sheets

SIGNAL PROCESSING SYSTEM AND SIGNAL PROCESSING METHOD

CROSS-REFERENCE TO RELATED APPLICATION

This application is based upon and claims the benefit of priority of the prior Japanese Patent Application No. 2012-019263 filed on Jan. 31, 2012, the entire contents of which are incorporated herein by reference.

FIELD

The present invention relates to a signal processing system and a method for communication signals with reduced peak-to-average power ratio.

BACKGROUND

In recent years, there has been widespreaded adaptation of highly efficient digital transmission in wireless communications such as Wideband Code Division Multiple Access (W-CDMA), Worldwide Interoperability for Microwave Access (WiMAX), Long Term Evolution (LTE) and etc. In such modern communication systems, the transmitted signals have become to be wideband and therefore these signals have a high peak-to-average power ratio (PAPR). The PAPR is defined as a ratio of a peak of a communication signal to an average of the communication signal.

In general, linear power amplifiers have more effective power efficiency as the PAPR decreases. Power amplifiers that can have a high power amplitude but have an average level far below the high power amplitude may consume higher power than that would be needed to output a predetermined average power level with a lower PAPR.

Usually, the PAPR of a signal may be reduced by clipping of the peak of the signal at a predefined level prior to pre-transmission amplification of signal with the high power amplifier (HPA). That is, the PAPR reduction unit may be provided to reduce the PAPR of the signal by clipping of the peak amplitude. Some sort of PAPR reduction prior to the amplification of signal in the PAPR reduction unit may lead to some benefits such as reduced costs and power efficiency improvement. However, such clipping of the peak amplitude of the signal in most of the PAPR reduction unit may introduce clipping noise into the output signal from the PAPR reduction unit that would be inputted into the HPA. Hence, the clipping noise included in the input signal of the HPA would be amplified. Therefore the HPA output signal became corrupted with this clipping noise. The clipping noise at the HPA output terminal increases the spectral regrowth and causes out-of-band spectrum emission.

The pre-transmission amplification of the signal may constitute one of the major costs associated with information transfer in the modern communication system. In general, while package cost dominates for low-power amplifiers, additional amplifier cost may be exponentially increased for higher peak-power amplifiers. For this reason, it should be important to reduce peak amplitude of signals to be transmitted as low as possible in the modern communication systems. This is one of the other reasons for making clipping unavoidable.

The nonlinearity of an amplifier may make the input signal energy to be converted into nonlinear spectral energy. Therefore, it would be needed to limit the peak amplitude of the input signal into the amplifier such that it only exceeds the upper limit of the linear region of amplification. After the amplifier has been linearized to a practical limit, generation of undesirable nonlinear spectral components may be reduced by clipping the peak amplitude of the input signal into the amplifier.

The need for peak reduction processing would be emphasized in so-called multi-channel signal (MCS) waveforms for wireless communication systems. Further, several important world-wide wireless standards (e.g., 802.11 (WiFi) and 802.16 (WiMAX)) have adopted orthogonal frequency-division multiplexing (OFDM) waveforms that use parallel transmission of many narrowband components. An OFDM signal has no spectral spacing between adjacent channels, and has short burst transmission rather than continuous one. The WiMAX waveform uses basestation transmissions including several hundred channels of OFDM waveforms to be allocated to many users. The large power peak variation of the many OFM channels may lead to a necessity of peak reduction processing to satisfy constraints, for example, for error vector magnitude for each of channels allocated for each user.

There are some known techniques to reduce peak amplitude of communication signal. One of these techniques is a clip-and-filter approach, in which communication signal passes through a "clipper" (i.e., hard-limiter), and then filter clipped communication signal to ensure satisfy regulatory spectral constraints. This approach is widespreadly used for peak-reduction of OFDM signals. The clipping process cause the clipped communication signal to differ its ideal shape, while infusing in-band and out-of-band noise into the clipped communication signal. The out-of-band noise generated during the clipping process would cause spectral regrowth in excess of the amounts permitted by spectral constraints. The filtering process in which the out-of-band noise in the clipped communication signal is filtered would establish the spectral constraints. However, in general, the clipping thresholds are set at relatively high values to meet a constraint for error vector magnitude, for example so that the clip-and-filter approach become not so effective. And, clipping process in the clip-and-filter approach introduces nonlinear interference, which cannot be removed by the out-of-band filtering.

Further, the relationship between peak amplitudes of signals and amplifier characteristics (it will also be referred to as amplifier curve) may be one of important characteristics of the high power amplifiers (HPAs) in the communication systems. In general, successful power amplifier may exhibit a nonlinear relationship between input power and output power. For low levels of input power, the output power of the amplifier depends on the input power linearly. However, for higher levels of input power, the output power of the amplifier may saturate at an upper limit which cannot be exceeded. The nonlinear relationship between input power and output power may appear near the saturation point at which the output power of the amplifier saturates. Operation of the amplifier near the saturation point (i.e., operation in nonlinear mode) may result in generating nonlinear distortion which can corrupt the shape of the spectral curve of the input signal. In order to reduce level of the non-linear distortion in HPA, a pre-distortion technique has been proposed to decrease the effects of nonlinearity.

In mobile communication systems, the nonlinear relationship between input power and output power may cause the frequency spectrum vicinity of the transmission frequency to have lifted side lobs so that leakage into adjacent frequency channels and adjacent channel interference may occur. The leakage power is explained as the Adjacent Channel Leakage Ratio (ACLR) or the Adjacent Channel Power Ratio (ACPR). The ACLR is normally defined as a ratio of the power of a channel to the adjacent leakage power. This leakage power is noise with respect to other channels.

Memory effects may be other phenomena related to power amplifier in the modern communication system. As the term "memory effects" means that there is dependence not only on the present sample but also on previous samples of the signal. Memory effects may be exhibited as a non-symmetrical spectrum around the central spectrum of the output signal of a power amplifier. In other words, although the desired spectrum of the signal is perfectly symmetrical, the spurious spectrum due to the distortion may be non-symmetrical with respect to the center of the signal spectrum.

Generally, HPA is operating in the nonlinear mode, and therefore, increases the level out-of-band spectral component in the output signal. The predistorter (PD) may be suppressing these nonlinear distortions due to the clipping noise, i.e., out-of-band components in order to maintain the level out-of-band spectrum at the HPA output appropriate. However the residual out-of-band spectrum due to PAPR reduction cannot be suppressed with the conventional PD because the signal with PAPR reduction (i.e. signal with high level of the out-of-band spectrum) acts as the reference signal for PD. that is, the signal corrupted by clipping noise becomes the reference signal for predistorter (PD). Thus the residual level of out-of-band components is presenting at the HPA every time despite the specific PD architecture, and even when the PD can pre-distort or linearize the reference signal to handle the non-linearity, the high level of the out-of-band spectrum, caused by the clipping noise, will translated directly to the HPA output.

The high level of the out-of-band spectrum causes interferences between the adjacent bands in the communication system. Normally the level of the out-of-band spectrum is characterized by the adjacent channel leakage ratio (ACLR) parameter. Therefore the levels of ACLR and the out-of-band emission must to be as low as possible.

Therefore, there is a need for a signal processing system and a method for handling both of the clipping noise and the nonlinear signal distortions in the HPA output signal. Further it is preferable that the memory effects caused in the HPA may be handled.

SUMMARY

According to an aspect of the embodiment, a signal processing system is provided. The signal processing system includes: a peak-to-average ratio (PAPR) reducer that reduces a peak-to-average ratio (PAPR) of an input signal $x(n)$ to generate a PAPR reduced signal $\hat{x}(n)$, wherein generation of a clipping noise signal $\epsilon_{CL}(n)$ is occurred in the PAPR reducer; a clipping noise processing system that splits the clipping noise signal $\epsilon_{CL}(n)$ into an in-band clipping signal $\epsilon_{CL,IN}(n)$ and an out-of-band clipping signal $\epsilon_{CL,OUT}(n)$, and generates an equivalent clipping noise signal $\epsilon^*_{CL}(n)$ that is defined as a weighted sum of a weighted in-band clipping signal $W_{IN}*\epsilon_{CL,IN}(n)$ and a weighted out-of-band clipping signal $W_{OUT}*\epsilon_{CL,OUT}(n)$, wherein the weighted in-band clipping signal $WIN*\epsilon_{CL,IN}(n)$ is generated by weighting the in-band clipping signal $\epsilon_{CL,IN}(n)$ with a first weight WIN, and the weighted out-of-band clipping signal $W_{OUT}*\epsilon_{CL,OUT}(n)$ is generated by weighting the out-of-band clipping signal $\epsilon_{CL,OUT}(n)$ with a second weight ($W_{OUT}$); a reduced noise signal generator that generates a reduced noise signal $\beta\epsilon^*_{CL}(n)$ that has a further reduced peak-to-average power level using the equivalent clipping noise signal $\epsilon^*_{CL}(n)$; a predistorter that distorts the PAPR reduced signal $\hat{x}(n)$ and the reduced clipping noise signal $\hat{x}(n)-\beta\epsilon^*_{CL}(n)$ to generate a distorted signal $z(n)$ and a distorted clipping noise signal $\Delta\epsilon(n)$ by applying an approximated inverse (HPA−1) of an amplification function (HPA) on the PAPR reduced signal $\hat{x}(n)$ and the reduced noise signal $\beta\epsilon^*_{CL}(n)$, respectively, wherein the approximated inverse (HPA−1) of an amplification function (HPA) is defined by a polynomial with predistorter coefficients $a_k$ or $a_{k,q}$; a amplifier input signal generator that generates a difference between the distorted signal $z(n)$ and the distorted clipping noise signal $\Delta\epsilon(n)$ as a high power amplifier (HPA) input signal $(z(n)-\Delta\epsilon(n))$; amplifies the high power amplifier (HPA) input signal $z(n)-\Delta\epsilon(n)$ with a gain G to generate an output signal $y(n)$; a reference signal generator that generates a reference signal $\hat{x}(n)-\alpha\epsilon^*_{CL}(n)$ that has a further reduced peak-to-average power level than the PAPR reduced signal ($\hat{x}(n)$) using the PAPR reduced signal $\hat{x}(n)$ and the equivalent clipping noise signal ($\epsilon^*_{CL}(n)$) or using the output signal $y(n)$, wherein the predistorter 304, 310 compares the reference signal $\hat{x}(n)-\alpha\epsilon_{CL}(n)$ and the output signal $y(n)$ to determine the predistorter coefficients $a_k$ or $a_{k,q}$.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
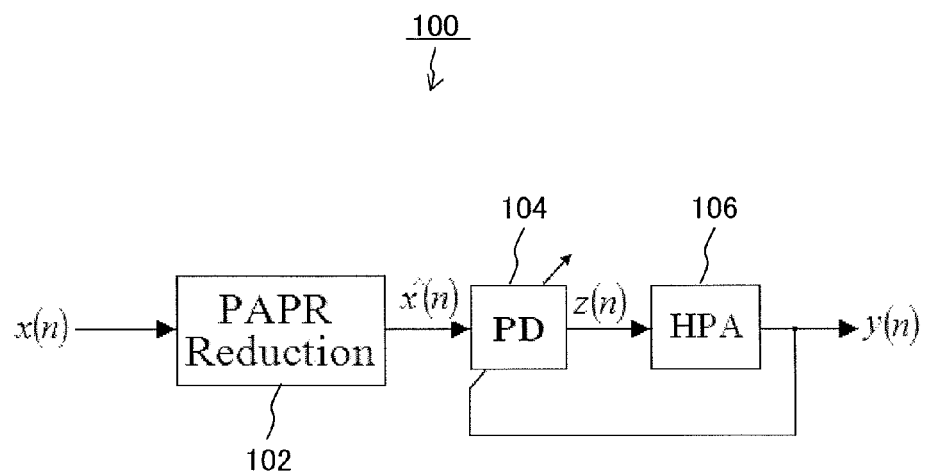
FIG. 1 is a schematic functional diagram illustrating a signal processing system in which a high peak-to-average power ratio (PAPR) reduction block, a predistorter (PD), and a high power amplifier (HPA) are serially connected according to a comparative art of embodiments of the present invention.

With referring to the drawings, the detailed description of the present invention will be provided. In the drawings, like numerals may describe similar components in different views. The drawings illustrate generally, by the way of example, but not by the way of limitation, embodiment discussed in the present document.

Features described and/or illustrated with respect to one embodiment can be used in one or more other embodiments in a same or similar way, and/or combine with or replace features in other embodiments.

To be noted, the term "have/having", "include/including" and "comprise/comprising" herein refers to existence of feature, component, step or assembly, not excluding existence or addition of one or more other features, components, steps, assemblies or a combination thereof.

Comparative Examples

At first, comparative examples of signal processing systems for signals with high peak-to-average power ratio (PAPR) will be explained with referring to FIGS. 1-5 to make understanding of technical features of the preferred embodiments according to the present invention easier. One of examples of the signal processing systems for signals with high PAPR includes a high peak-to-average power ratio (PAPR) reduction block 102, a predistorter (PD) 104, and a high power amplifier (HPA) 106, which are serially connected.

FIG. 1 is a schematic functional diagram illustrating a signal processing system 100 including a high peak-to-average power ratio (PAPR) reduction block 102, a predistorter (PD) 104, and a high power amplifier (HPA) 106. In this figure, elements that are not necessary for understanding have been omitted.

A baseband complex communication signal x(n) is forwarded to the PAPR reduction block 102. The argument "n" may be called as a time index and indicates a discritized time or information about time. A continuous time may also be exemplified to be indexed by the argument "n". The PAPR reduction block 102 may reduce the PAPR of the communication signal x(n) in such a way as to minimize spectral regrowth and to add as little noise in to communication signal x(n). Moreover, the PAPR reduction block 102 desirably achieves PAPR reduction as much as possible within given constraints. The PAPR reduction block 102 generates an output a communication signal x^(n). As will be explained in more detail below, the PAPR reduction block 102 may clip all spectral peaks in the communication signal x(n) exceeding a threshold. This clipping operation generates clipping noise signal $\epsilon_{CL}(n)$, and the clipping noise signal $\epsilon_{CL}(n)$ may be added to the output signal from the PAPR reduction block 102 x^(n). The communication signal x^(n) can be expressed as below:

$$x\hat{}(n)=x(n)+\epsilon_{CL}(n)$$

Figure 2:
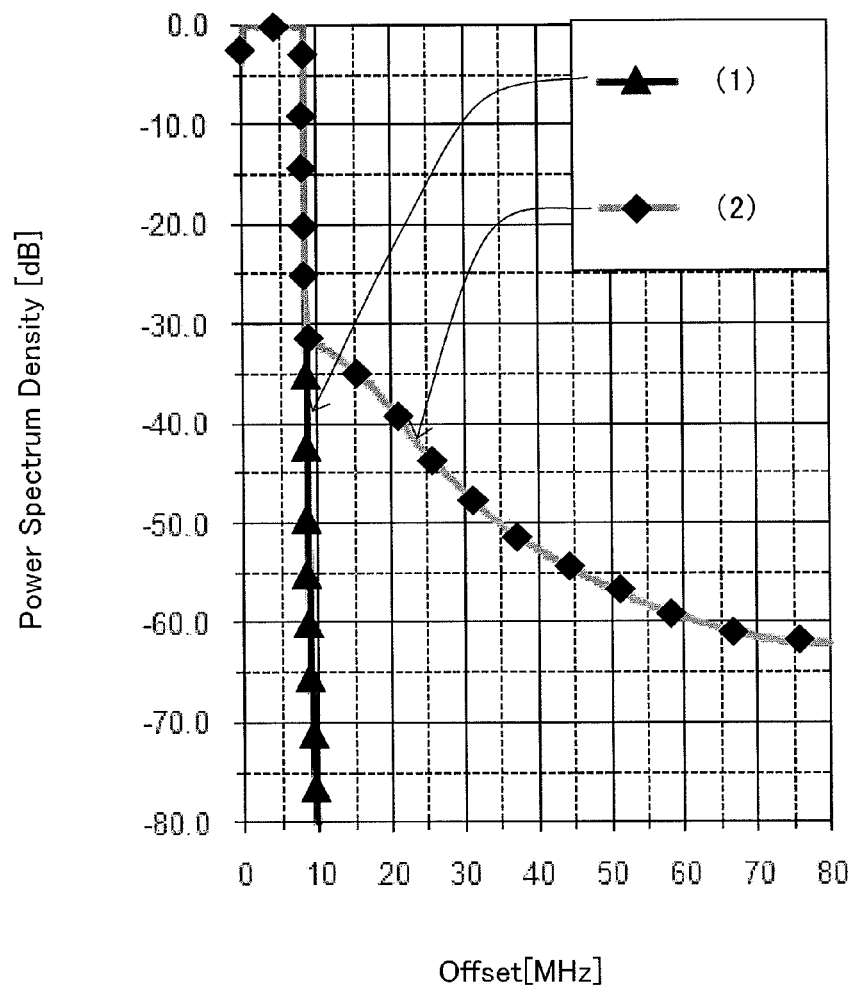
FIG. 2 is a diagram illustrating the exemplary spectrum of the original signal $x(n)$ (curve(1)) and exemplary spectrum of output signal $\hat{x}(n)$ of the PAPR reduction block after clipping at 6 dB (curve (2))

FIG. 2 is a diagram illustrating the exemplary spectrum of the original signal x(n) with RF bandwidth 20 MHz at the input terminal of the PAPR reduction block 102 (curve(1)) and exemplary spectrum of output signal x^(n) of the PAPR reduction block 102 after clipping at 6 dB (curve (2)). The spectrum for the PAPR output signal x^(n) has high level of the spectral regrowth which increases the out-of-band respect to the spectrum of the original signal x(n).

After processing in the PAPR reduction block 102, the communication signal x^(n) passes to the predistorter (PD) 104 to output a distorted version of the communication signal z(n). The PD 104 is provided to extend the linearity for the high power amplifier (HPA) 106. The PD 104 distorts the reference signal, i.e., the PAPR output signal x^(n), such that after experiencing distortion in the HPA 106, the resulting amplified version of the communication signal y(n) in FIG. 1 appears to have undergone a "linear" amplification.

Figure 3:
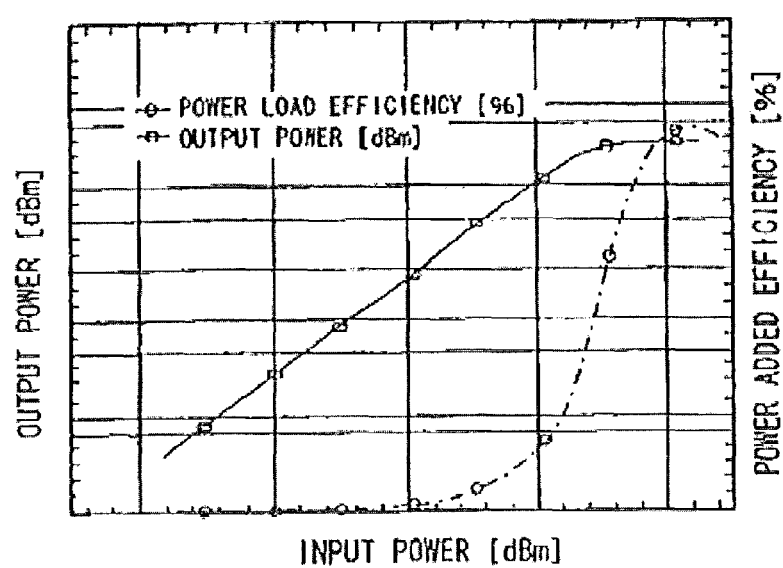
FIG. 3 is a diagram illustrating an example of the output power and the efficiency characteristics of a power amplifier.

FIG. 3 is a diagram illustrating an example of the output power and the efficiency characteristics of the HPA 106. In FIG. 3, it can be seen that the input/output characteristic of the HPA 106 are nonlinear as indicated by the solid line. Nonlinear distortion occurs due to this nonlinear characteristic of the HPA 106 and is compensated by the predistortion process in the predistorter 104 desirably. In other words, the predistorter 104 may be designed to do so.

The problem arises with a transmission of the high peak-to-average power ratio signals (W-CDMA, OFDM, WiMAX, LTE, etc.). In order to provide high amplification efficiency, the HPA 106 is operating usually with low OBO (output back-off) in the nonlinear region of the input/output characteristic. For matching of the peak power of the input signal z(n) with the preselected OBO level, the PAPR reduction or hard clipping operations are necessary. Such clipping limits the HPA input signal sweep in order to prevent HPA input overdriving.

The high level of the out-of-band spectrum (the curve (2) in FIG. 2) causes interferences between the adjacent channels and must be reduced as much as it possible. Normally the level of the out-of-band spectrum is characterized by the Adjacent Channel Leakage Ratio (ACLR). Therefore the levels of ACLR and the out-of-band emission must to be as low as possible.

The distorted version of the communication signal z(n) that is output from the PD 104 enters to the HPA 106.

The PD 104 can be implemented by a look-up table or by an analytical function such as a polynomial function. It acts as a complex gain depending on the magnitude of the input signal x^(n). For a given input signal x^(n), the output signal z(n) of the PD 104 may be defined as $$z(n)=PD(x\hat{}(n))\cdot x\hat{}(n).$$

The objective of the PD 104 is to find a transformation of the signal:

$$z(n)=HPA^{-1}(x\hat{}(n)),$$

such that in tandem combination with nonlinear HPA 106 will result in an identity signal processing system that produces the output signal y(n) without any distortions at the output of HPA i.e., $$y(n)=G\cdot x\hat{}(n),$$

where HPA is a function of the HPA 106.

In the above equation, a constant G is the gain of the HPA 106, which for the simplicity can be assumed equal to 1. In most practical cases, it is not possible to get the exact solution for. However, the approximate solution for inverse of the HPA nonlinearity can be obtained during the direct training, i.e. $y(n) \approx G \cdot \hat{x}(n)$, there is unobserved random $\epsilon^*(n)$ error with mean zero. Thus, $$\epsilon^*(n) = y(n) - \hat{x}(n).$$

When the polynomial PD structure is assumed and y(n), $\hat{x}(n)$, and z(n) are given, PD training task is to find parameters ak of memoryless polynomial PD model:

$$PD(\hat{x}(n)) = a_0 + a_1|\hat{x}(n)| + a_2|\hat{x}(n)|^2 + \ldots .$$

The distorted version of the communication signal z(n) output from the PD 104 may be expressed as $$z(n) = PD(\hat{x}(n)) \cdot \hat{x}(n) = a_0 \hat{x}(n) + a_1|\hat{x}(n)|\hat{x}(n) + a_2|\hat{x}(n)|^2 \hat{x}(n) + \ldots .$$

After the distorted version of the communication signal z(n) passes through the HPA 106, the amplified version of the communication signal y(n) (although the gain of the HPA 106 may sometime assumed equal to 1 in the following discussion) may be:

$$y(n) = G \cdot (a_0 \hat{x}(n) + a_1|\hat{x}(n)|\hat{x}(n) + a_2|\hat{x}(n)|^2 \hat{x}(n) + \ldots ).$$

Ideally, the amplified version of the communication signal y(n) in the above equation equals to x(n). Using this expression of y(n), the error $\epsilon^*(n)$ can be expressed as $$\epsilon^*(n) = y(n) - \hat{x}(n) = (G \cdot a_0 - 1)\hat{x}(n) + G \cdot a_1|\hat{x}(n)|\hat{x}(n) + G \cdot a_2|\hat{x}(n)|^2 \hat{x}(n) + \ldots .$$

When memory effect is considered, a memory polynomial PD model may be defined by using parameters $a_{k,q}$ as:

$$PD(x^\wedge(n)) = \sum_{k=1}^{K} \sum_{q-1}^{Q} a_{k,q} x^\wedge(n-q) \cdot |x^\wedge(n-q)|^{k-1}$$

In the following description, although the memoryless polynomial PD model will be mainly discussed, the discussion can easily extended to the case of the memory polynomial PD model or other models that treats the memory effects by ordinary skilled person of the art.

If the PD 104 works ideally, the error $\epsilon^*(n)$ converges to zero and prefect linearization is achieved. However, in the actual PD 104, the error $\epsilon^*(n)$ may not converge to zero because $z(n) = HPA-1(\hat{x}(n))$ is an approximate solution. The target function of the parameters ak is adjusted to values leading to the minimization of the energy functional $\|\epsilon^*(n)\|$ of the error signal $\epsilon^*(n)$. With such polynomial PD coefficient ak adjusting, the level of the out-of-band spectrum components became minimized. The error signal $\epsilon^*(n)$ may also be referred to as the approximation error.

It may be noted that when $\epsilon^*(n) = 0$, perfect solution of $z(n) = HPA-1(\hat{x}(n))$ can be obtained and perfect HPA linearization is achieved. However, because $\hat{x}(n) = x(n) + \epsilon_{CL}(n)$, $$y(n) = \hat{x}(n) + \epsilon^*(n) = \hat{x}(n) = x(n) + \epsilon_{CL}(n)$$

The HPA output signal after linearization still has a noise term $\epsilon_{CL}(n)$ that causes the spectral regrowth and out-of-band spectrum.

In the case when PAPR operation has been implemented for the original signal x(n) before the linearization as illustrated in FIG. 1, the situation is completely different. Thus the polynomial coefficients $a_k$ that are minimizing the energy For the PD (or linearizer) 104, the PAPR output signal $\hat{x}(n)$ became the reference signal as it illustrated in FIG. 1. Thus even with the perfect linearization, the high level of the out-of-band spectrum due to the clipping will translated directly to the HPA output y(n).

Figure 4:
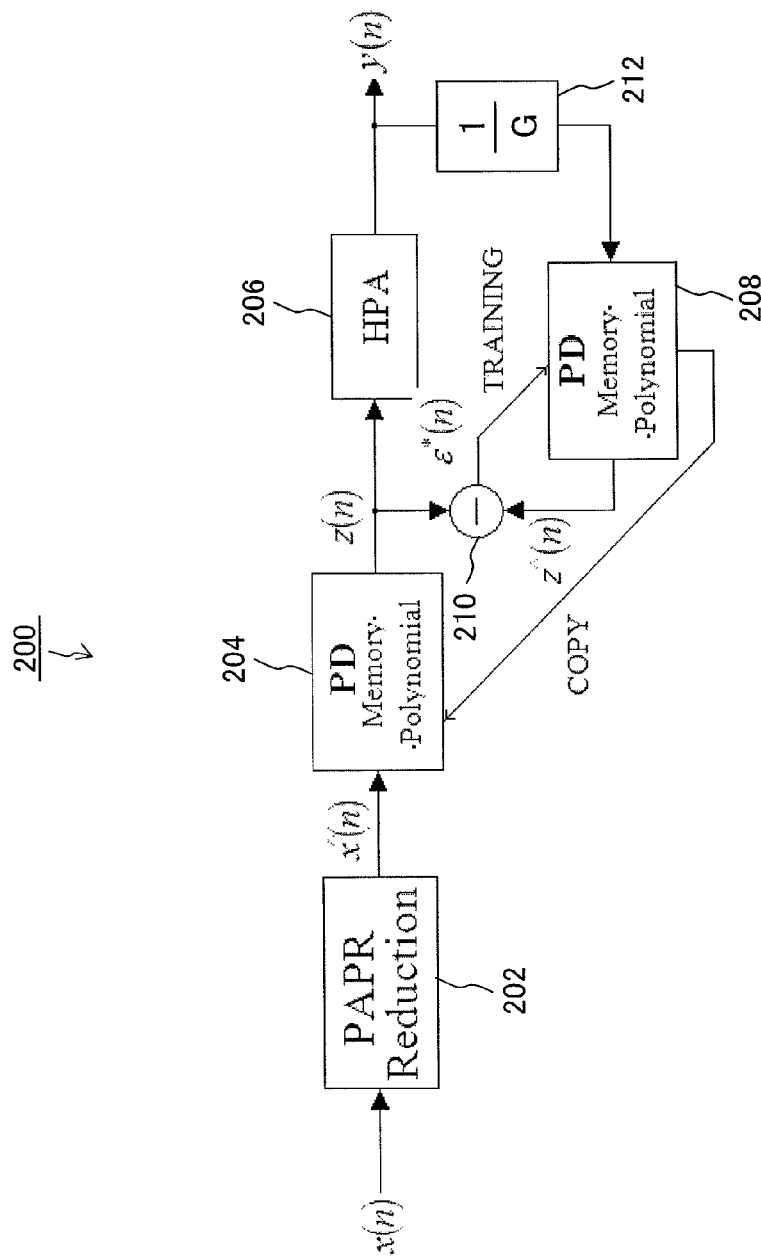
FIG. 4 is a functional diagram illustrating a signal processing system that is used for predistorter identification according to a comparative art of embodiments of the present invention.

FIG. 4 is a functional diagram illustrating a signal processing system 200 that is used for predistorter (PD) identification according to an embodiment of comparative art of the present invention.

The signal processing system 200 illustrated in FIG. 4 includes, in addition to a PAPR reduction block 202 that has a similar functions and structure with the PAPR reduction block 102, a (actual) predistorter (a first predistorter) 204, and a high power amplifier (HPA) 206 that has a similar functions and structure with the HPA 206 to generate an output signal y(n), a dummy presidtorter (PD) (a second predistorter) 208 has been provided. The signal processing system 200 may operate in a training mode and a linearization mode. In the training mode for identifying function of the PD 204, the actual PD 204 generates a signal that is identical with an input signal to the PD 204 as an output signal, and the dummy PD 208 receives a divided output signal y(n)/G that is obtained by dividing the output signal y(n) from the HPA 206 with gain G of the HPA 206 at a divisor 212. Ideally, the output signal $\hat{z}(n)$ of the dummy PD 208 equals to $G \cdot y(n)$. The constant G will be assumed equal to 1 in the following discussion only for the simplicity. However, in general, the gain of the HPA 206 may be not equal to 1 but can be any value larger than 1. In a linearization mode of the signal processing system 200, the PD 204 may transform the input signal to generate the output signal on the basis with the function of the PD 204 that is identified in the training mode. Further, an error estimating means 210 that estimates an error e(n) defined as $$e(n) = y(n) - \hat{z}(n)$$

is provided in a feedback path to be used for the PD identification, e.g., for determining PD model parameters $a_k$. The error estimating means 210 can be realized by using a subtracter or an adder and an inverter.

When y(n) and z(n) are given, a task to be carried out is to find the appropriate PD's coefficients $a_k$ in the memoryless polynomial PD model or $a_{k,q}$ in the memory polynomial PD model of the PDs 204, 208. This procedure for finding the PD's coefficients $a_k$ or $a_{k,q}$ is performed in the training mode of the signal processing system 200. In the training mode, the PD 204 has a unitary transfer function, i.e., the PD 204 passes through the input signal to its output signal without any modification. The actual PD 204 is an exact copy of the dummy PD 208 after the function of PD is determined, for example by identifying PD's coefficients $a_k$ or $a_{k,q}$ in the training mode. That is, the PD 204 transfers the input signal based on the polynomial function defined by the PD's coefficients $a_k$ or $a_{k,q}$, an look-up table, or the like.

The algorithm converges when the error energy $\epsilon e(n)\|$ is minimized. The PD's coefficients $a_k$ or $a_{k,q}$ can be estimated by using so-called least square (LS) method. For example, The PD's coefficients $a_{k,q}$ may obtained by the following steps.

When the PDs 204, 208 may be defined as the memory polynomial, the output z(n) of the PD 204 and the output $\hat{z}(n)$ of the PD 208 are expressed as $$z(n) = \sum_{k=1}^{K} \sum_{q-1}^{Q} a_{k,q} x^\wedge(n-q) \cdot |x^\wedge(n-q)|^{k-1}$$

-continued and $$z^{\wedge}(n) = \sum_{k=1}^{K} \sum_{q=1}^{Q} a_{k,q} y(n-q) \cdot |y(n-q)|^{k-1}$$

where y(n) is an output of the HPA 206. Introducing new variables $u_{k,q}$ $$u_{k,q} = y(n-q) \cdot |y(n-q)|^{k-1},$$

the relation between the output of the PD 204 z(n) and the output of the PD 208 z^(n) can be written in a matrix form:

$$Z^{\wedge} = U \cdot A$$

$$Z^{\wedge} = [z(0), z(1), \ldots, z(N-1)]^T,$$

$$U = [\bar{u}_{10}, \ldots, \bar{u}_{KO}, \ldots, \bar{u}_{1Q}, \ldots \bar{u}_{KQ}],$$

$$\bar{u}_{kq} = [u_{kq}(0), \ldots, \bar{u}_{kq}(N-1)]^T,$$

$$A = [a_{10}, \ldots, a_{KO}, \ldots, a_{1Q}, \ldots, a_{KQ}]^T.$$

The least square solution for the PD's coefficients $a_{k,q}$ may be:

$$A = (U^H \cdot U)^{-1} \cdot U^H \cdot Z,$$

where $(\ )^H$ denotes complex conjugate transpose.

Embodiment

Referring to FIGS. 5-11, an embodiment of the present invention will be explained.

In the case when PAPR operation has been implemented for the original signal x(n) before the linearization as illustrated in FIG. 1, the situation is completely different. That is, the polynomial coefficients $a_k$ or $a_{k,q}$ that are minimizing the energy $\|\epsilon^*(n)\|$ does not automatically guarantees the spectral regrowth and the out-of-band spectrum minimization. Where the energy $\|\epsilon^*(n)\|$ may be called as a (objective) cost function in the optimization problem in the mathematical or engineering field. Actually, in such the situation, the original undistorted signal x(n) becomes the useful signal, and the total error term whose energy must be minimized became, using x^(n)=x(n)+$\epsilon_{CL}$(n):

$$\epsilon^*(n) = y(n) - x^{\wedge}(n) = y(n) - x(n) - \epsilon_{CL}(n),$$

where $\epsilon_{CL}$(n) includes the clipping noise components and $\epsilon^*(n)$ includes the error components due to approximation solution for HPA inverse function HPA−1. When a total disturbing term $\epsilon(n)$ is defined as $$\epsilon(n) = \epsilon_{CL}(n) + \epsilon^*(n),$$

the total disturbing term $\epsilon(n)$ is minimized by selecting the appropriate PD's coefficients $a_k$ or $a_{k,q}$.

In this situation, it is needed to find the PD coefficients $a_k$ or $a_{k,q}$ such that the HPA output signal may be more close to the original signal x(n) and may have better out-of-band spectrum component suppression. This task may be solved when parameters $a_k$ or $a_{k,q}$ of polynomial PD model are determined to minimize the energy $\|\epsilon(n)\| = \|\epsilon_{CL}(n) + \epsilon^*(n)\|$ where $\epsilon_{CL}$(n) includes the clipping noise components and $\epsilon^*(n)$ includes the approximation error components.

Figure 6:
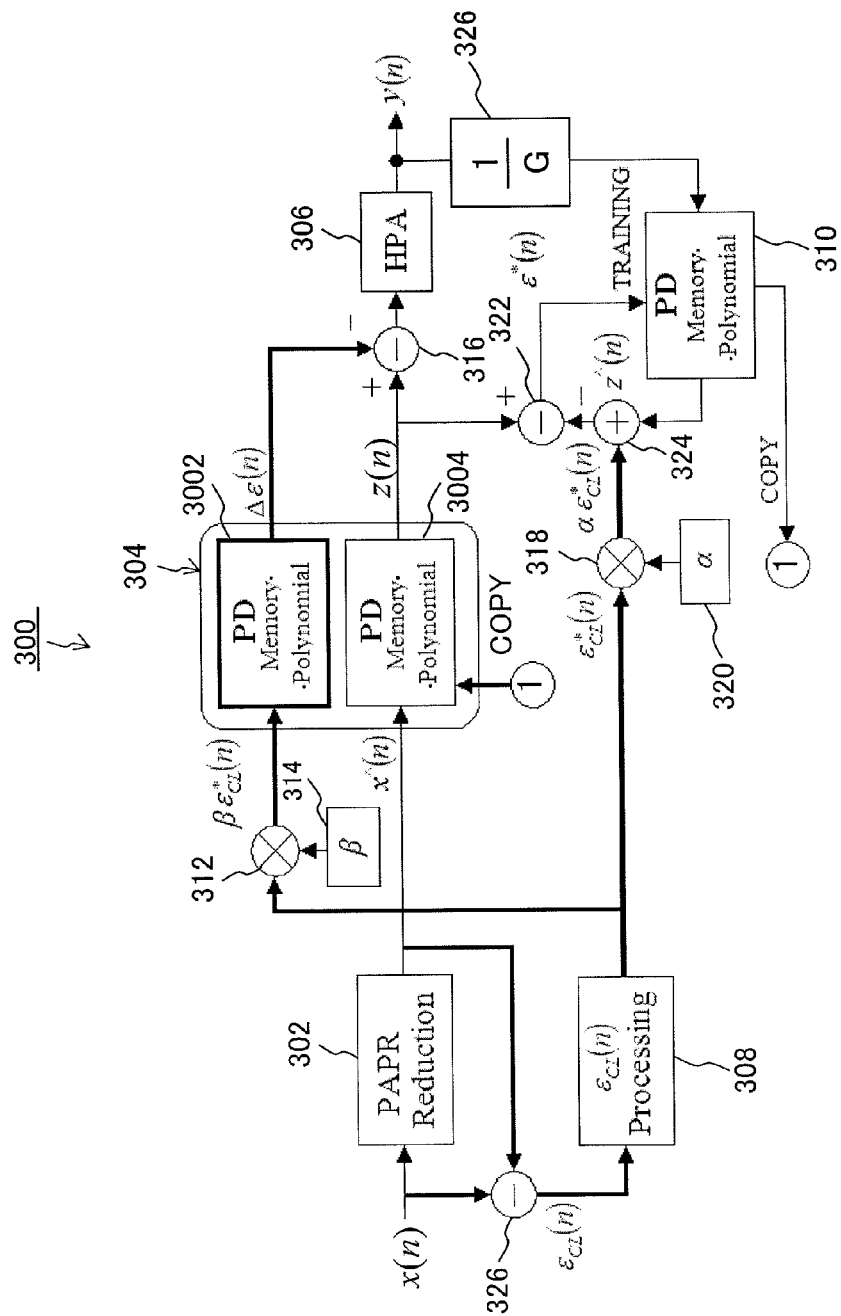
FIG. 6 is a functional diagram illustrating a signal processing system (linearizer) for signals with reduced PAPR according to an embodiment of the present invention.
Figure 8:
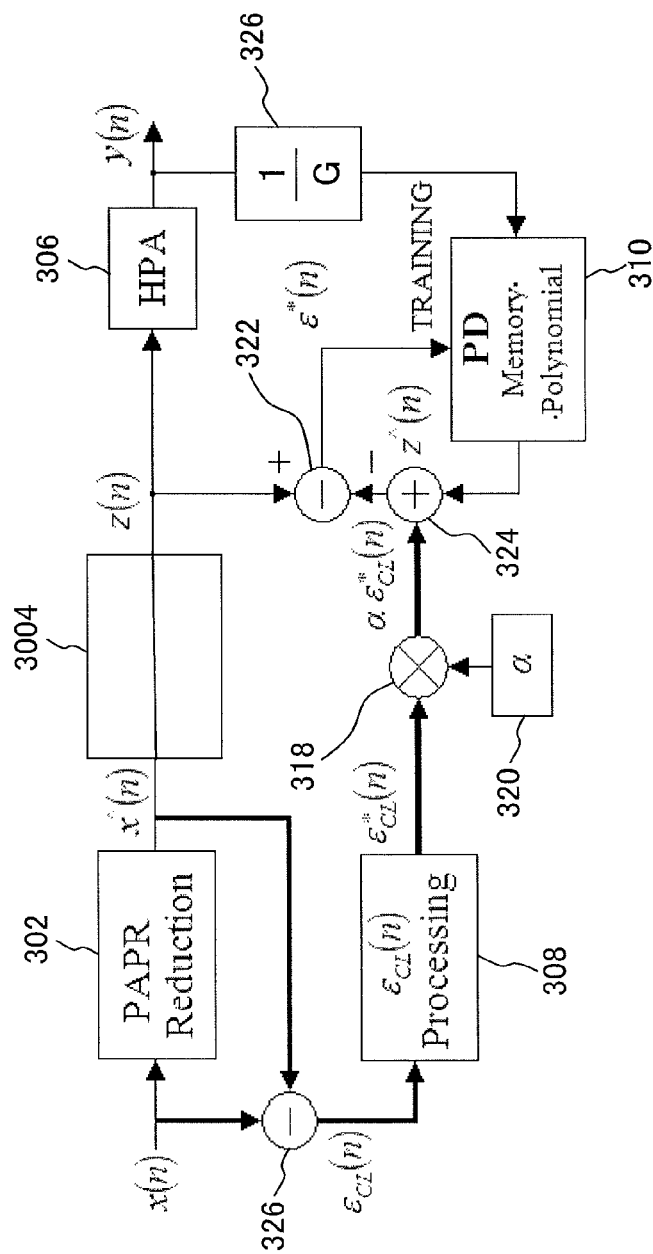
FIG. 8 is a functional diagram illustrating a linearizer for signals with reduced PAPR that is operating in a training mode.
Figure 9:
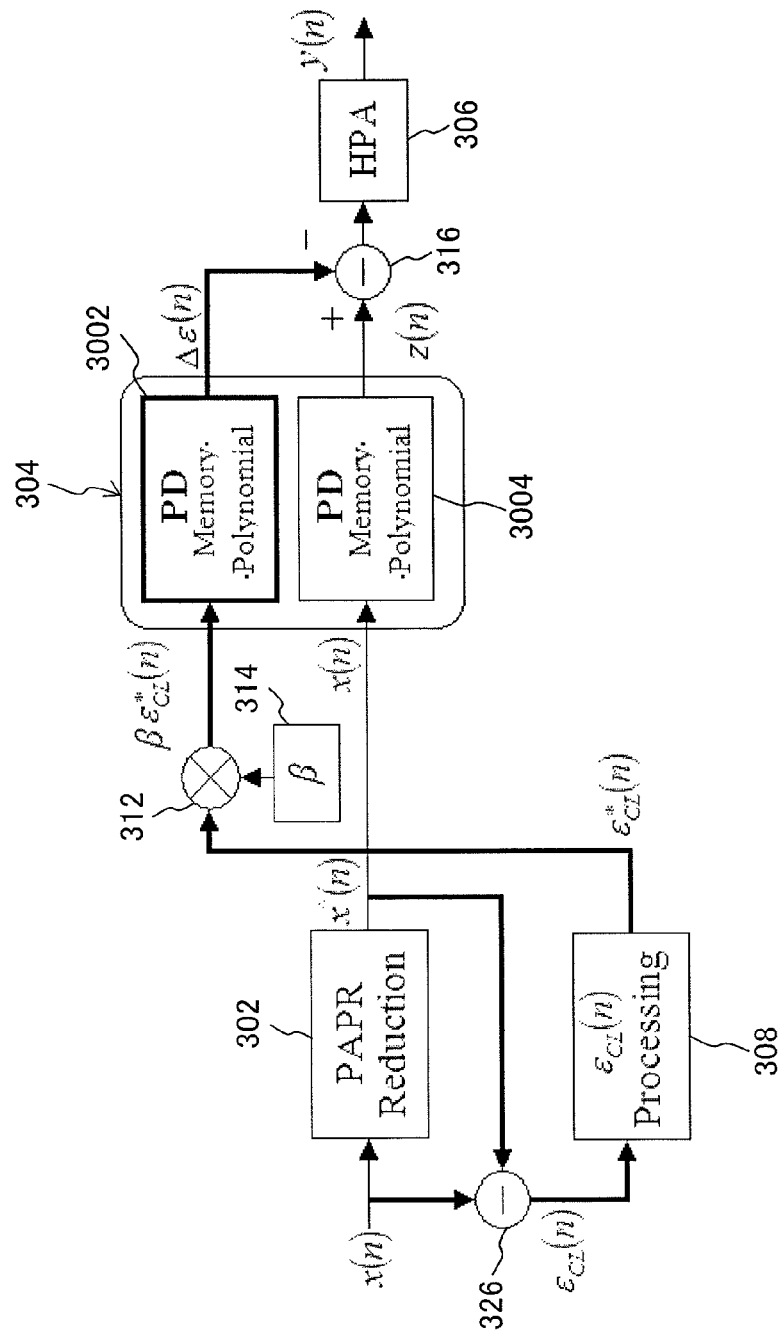
FIG. 9 is a functional diagram illustrating the linearizer for signals with reduced PAPR in a linearization mode.

FIG. 6 is a functional diagram illustrating a signal processing system (linearizer) 300 for signals with reduced PAPR. The signal processing system 300 may operate in a training mode and a linearization mode. The operation of the signal processing system 300 in a training mode is illustrated in FIG. 8, and an operation of the signal processing system 300 in the linearization mode is illustrated in FIG. 9.

Figure 5:
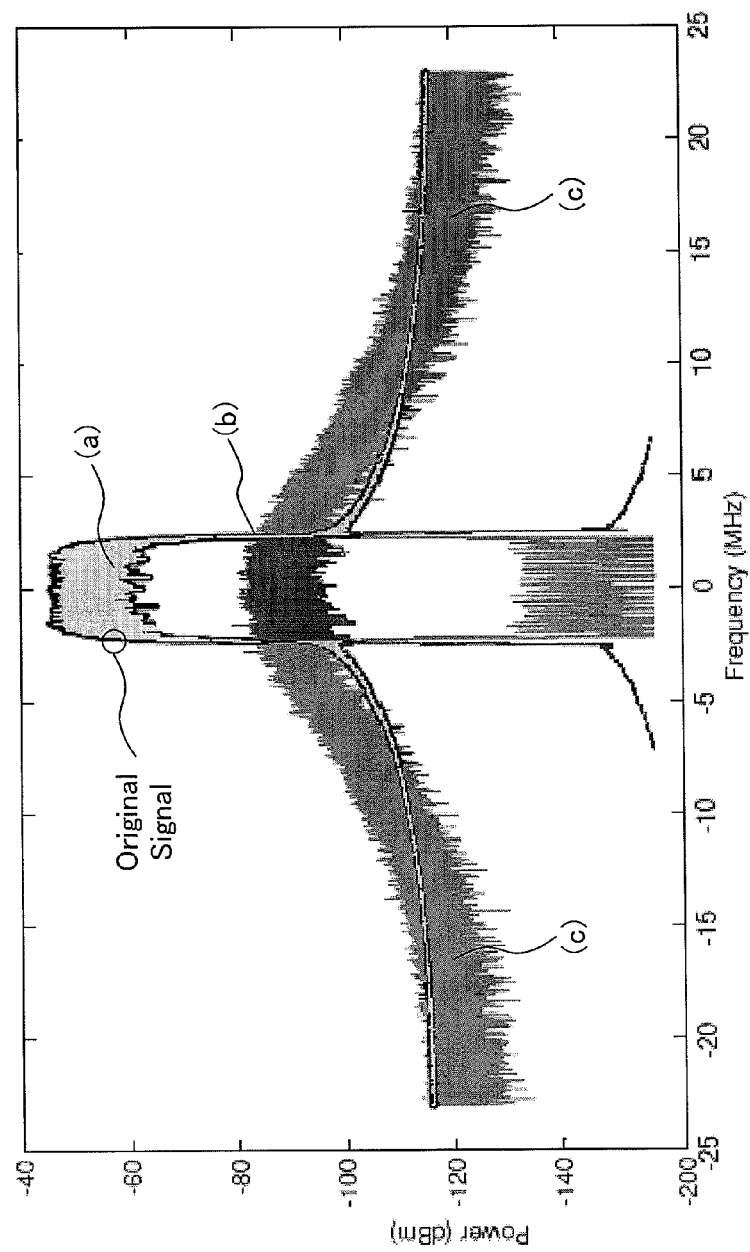
FIG. 5 is a diagram illustrating a spectral comparison of an exemplary communication signal (original signal), exemplary clipping noise signal (a), exemplary in-band clipping noise signal $\epsilon_{CL,IN}(n)$ (b) and out-of-band clipping noise signal $\epsilon_{CL,OUT}(n)$ (c) generated by clipping of the peak amplitude of the communication signal.

In this embodiment, the clipping noise signal $\epsilon_{CL}$(n) may be divided into in-band part (in-band components) $\epsilon_{CL,IN}$(n) and out-of-band part (out-of-band components) $\epsilon_{CL,OUT}$(n) as illustrated in FIG. 5 so that the in-band part $\epsilon_{CL,IN}$(n) and the out-of-band part $\epsilon_{CL,OUT}$(n) of the output signal y(n) of the HPA due to distortion would to be controlled separately.

FIG. 5 is a diagram illustrating a spectral comparison of an exemplary communication signal (original signal) x(n), exemplary clipping noise signal $\epsilon_{CL}$(n) (curve (a)), exemplary in-band clipping noise signal $\epsilon_{CL,IN}$(n) (curve (b)) and out-of-band clipping noise signal $\epsilon_{CL,OUT}$(n) (curve (c)) generated by clipping of the peak amplitude of the communication signal x(n). Using the in-band clipping noise signal $\epsilon_{CL,IN}$(n) and the out-of-band clipping noise signal $\epsilon_{CL,OUT}$(n), the equivalent clipping noise signal $\epsilon^*_{CL}$(n) can be expressed as a sum of in-band clipping signal $\epsilon_{CL,IN}$(n)$*W_{IN}$ and out-of-band clipping signal $\epsilon_{CL,OUT}$(n)$*W_{OUT}$ where $W_{IN}$ and $W_{OUT}$ are weights for the in-band part $\epsilon_{CL,IN}$(n) and the out-of-band part $\epsilon_{CL,OUT}$(n), respectively:

$$\epsilon^*_{CL}(n) = \epsilon_{CL,IN}(n) \cdot W_{IN} + \epsilon_{CL,OUT}(n) \cdot W_{OUT}.$$

As illustrated in FIG. 6, the signal processing system 300 includes a PAPR reduction block or a PAPR reducer 302, (actual) predistorter (PD) (a first predistorter) 304, a high power amplifier (HPA) 306, a clipping noise processing system 308, a dummy PD (a second predistorter) 310. The PAPR reduction block 302 has a similar functions and structure with the PAPR reduction block 202. The PD 304 further includes PDs 3002, 3004 for processing the PAPR reduced (clipped) noise signal $\epsilon^*_{CL}$(n) and the output signal x^(n) from the PAPR reduction block 302, respectively. As discussed below, the PAPR reduced (clipped) noise signal $\epsilon^*_{CL}$(n) is generated in a PAPR reduced (clipped) noise signal processing block 308 that receives the clipping noise signal $\epsilon_{CL}$(n) and generates the equivalent clipping noise components $\epsilon^*_{CL}$(n). The equivalent clipping noise signal $\epsilon^*_{CL}$(n) is the sum of in-band clipping signal $\epsilon_{CL,IN}$(n)$*W_{IN}$ and out-of-band clipping signal $\epsilon_{CL,OUT}$(n)$*W_{OUT}$. Therefore, the signal processing system 300 includes the clipping noise signal processing block 308.

The PAPR reduction block 302 may be configured to reduce the peak power of the input signal x(n) in any suitable manner. The PAPR reduction block 302 may also referred to as a peak-to-average ratio (PAPR) reducer 302 that reduces a peak-to-average ratio (PAPR) of an input signal (x(n)) to generate a PAPR reduced signal (x^(n)). In the PAPR reducer 302, generation of a clipping noise signal ($\epsilon_{CL}$(n)) is occurred unavoidably. The PAPR reduction block 302 may also correspond to a PAPR reduction means that reduces the PAPR of the input signal, for example by using so-called clip-and-filter technique, in which communication signal passes through a "clipper" (i.e., hard-limiter), and then filter clipped communication signal to ensure satisfy regulatory spectral constraints. For example, the PAPR reduction block 302 may subtract portions whose amplitude exceeds a threshold from the signal. This process may be called to as a clipping process. The PAPR reduction block 302 may also inhibit transmission of unwanted spectral energy, for example frequency component outside a spectral mask. This process may be called to as a filtering process. These operations may functionally define a PAPR reduction process. However, in the PAPR reduction block 302, an unavoidable clipping noise signal $\epsilon^*_{CL}$(n) would be generated during the clipping process so that the output signal from the PAPR reduction block 302 can be written as x^(n)+ε*_{CL}(n), i.e., the output signal from the PAPR reduction block 302 includes noise components.

The actual PD 304 (3002, 3004) has a similar functions and structure with the PD 204, and the dummy PD 310 has a similar functions and structure with the PD 208. In the training mode, the PD 304 has a unitary transfer function, i.e., the PD 304 passes through the input signal to its output signal without any modification. The actual PD 304 is an exact copy of the dummy PD 310 after the function of PD is determined, for example by identifying PD's coefficients $a_k$ or $a_{k,q}$ in the training mode. That is, the PD 304 transfers the input signal based on the polynomial function defined by the PD's coefficients $a_k$ or $a_{k,q}$, an look-up table, or the like.

The PDs 304 (3002, 3004), 310 can be implemented by a look-up table or by an analytical function such as a memoryless polynomial function:

$$PD(x^\wedge(n)) = a_0 + a_1|x^\wedge(n)| + a_2|x^\wedge(n)|^2 + \ldots,$$

or a memory polynomial function:

$$PD(x^\wedge(n)) = \sum_{k=1}^{K} \sum_{q-1}^{Q} a_{k,q} x^\wedge(n-q) \cdot |x^\wedge(n-q)|^{k-1}.$$

When the PDs 304 (3002, 3004), 310 can be implemented by the memory function, the PDs 304 (3002, 3004), 310 may have memory Q and highest nonlinearity order K. Although Many PD models include odd-order terms only, i.e. k=l+1 where l is an integer, it is known that even-order nonlinear terms in the polynomial function may further reduce spectral regrowth.

The clipping noise signal $\epsilon_{CL}(n)$ is generated by subtracting an output signal x^(n) of the PAPR reduction block 302 from an original communication signal x(n) at a first error estimating means 326. The first error estimating means 326 can be realized by using a subtracter or an adder and an inverter.

The clipping noise signal $\epsilon_{CL}(n)$ enters the clipping noise signal processing block 308 to generate the equivalent clipping noise signal $\epsilon^*_{CL}(n)$. The clipping noise signal $\epsilon^*_{CL}(n)$ is transferred to an second error estimating means 322 that has a similar functions and structure with the error estimating means 210 in the training mode and to the PD 3002 for processing the clipping noise signal $\epsilon^*_{CL}(n)$ in the linearization mode.

The clipping noise signal processing block 308 may be also referred to as a clipping noise processing system that splits the clipping noise signal $\epsilon_{CL}(n)$ into an in-band clipping signal $\epsilon_{CL,IN}(n)$ and an out-of-band clipping signal $\epsilon_{CL,OUT}(n)$, and generate an equivalent clipping noise signal $\epsilon^*_{CL}(n)$ that is defined as a weighted sum of a weighted in-band clipping signal ($W_{IN}*\epsilon_{CL,IN}(n)$) and a weighted out-of-band clipping signal $W_{OUT}*\epsilon_{CL,OUT}(n)$, wherein the weighted in-band clipping signal $W_{IN}*\epsilon_{CL,IN}(n)$ is generated by weighting the in-band clipping signal $\epsilon_{CL,IN}(n)$ with a first weight $W_{IN}$, and the weighted out-of-band clipping signal $W_{OUT}*\epsilon_{CL,OUT}(n)$ is generated by weighting the out-of-band clipping signal $\epsilon_{CL,OUT}(n)$ with a second weight $W_{OUT}$.

Figure 7:
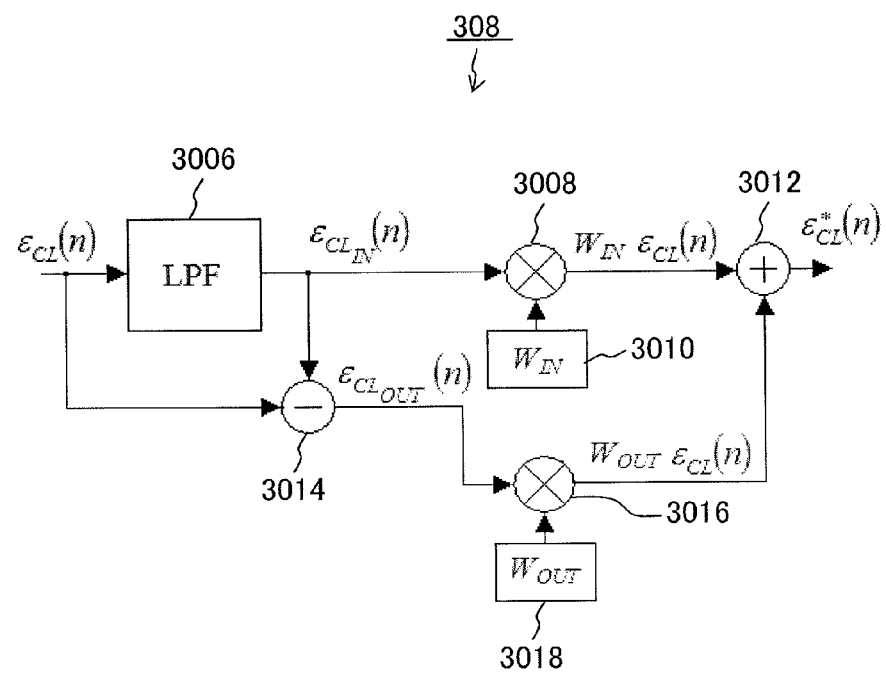
FIG. 7 is a diagram illustrating a clipping noise $\epsilon_{CL}(n)$ processing block in the linearizer illustrated in FIG. 6, which generates an equivalent clipping noise signal $\epsilon^*_{CL}(n)$ by operating a weighted sum of the in-band clipping signal $\epsilon_{CL,IN}(n)$ and the out-of-band clipping signal $\epsilon_{CL,OUT}(n)$.

FIG. 7 is a diagram illustrating a clipping noise processing block 308 in the linearizer 300 illustrated in FIG. 6, which generates an equivalent clipping noise signal $\epsilon^*_{CL}(n)$ by operating a weighted sum of the in-band clipping signal $\epsilon_{CL,IN}(n)$ and the out-of-band clipping signal $\epsilon_{CL,OUT}(n)$. The configuration of the clipping noise processing block 308 would be recognized as an example so that other configuration that provides the same or similar function can be allowed.

As illustrated in FIG. 7, the clipping noise processing block 308 includes a low-pass filter (LPF) 3006, a subtracter 3014, weight generators 3008, 3016, mixers 3008, 3016, and adder 3012.

An input signal $\epsilon_{CL}(n)$ is separated into 2 signals, i.e., the in-band clipping signal $\epsilon_{CL,IN}(n)$ and the out-of-band clipping signal $\epsilon_{CL,OUT}(n)$. The in-band clipping signal $\epsilon_{CL,IN}(n)$ is obtained after the input signal $\epsilon_{CL}(n)$ passes through the LPF 3006. The out-of-band clipping signal $\epsilon_{CL,OUT}(n)$ is obtained by subtracting the in-band clipping signal $\epsilon_{CL,IN}(n)$ from the input signal $\epsilon_{CL}(n)$. The in-band weight WIN that is generated at the weight generator 3008 is multiplied with the in-band clipping signal $\epsilon_{CL,IN}(n)$ to generate a weighted in-band clipping signal $W_{IN}*\epsilon_{CL,IN}(n)$ at the mixer 3008. In the similar way, a weighted out-of-band clipping signal $W_{OUT}*\epsilon_{CL,OUT}(n)$ is generated at the mixer 3016 by multiplying an out-of-band weight $W_{OUT}$ that is generated at the weight generator 3018 with the out-of-band clipping signal $\epsilon_{CL,OUT}(n)$. The weighted in-band clipping signal $W_{IN}*\epsilon_{CL,IN}(n)$ and the weighted out-of-band clipping signal $W_{OUT}*\epsilon_{CL,OUT}(n)$ are combined at the adder 3012 to generate the equivalent clipping noise signal $\epsilon^*_{CL}(n)$.

When the in-band weight WIN and the out-of-band weight $W_{OUT}$ are unitary, i.e., $W_{IN}=W_{OUT}=1$, $$\epsilon^*_{CL}(n) = \epsilon_{CL,IN}(n) + \epsilon_{CL,OUT}(n) = \epsilon_{CL}(n),$$

so that no clipping signal processing is performed at the clipping noise processing block 308.

The original communication signal x(n) enters to the PAPR reduction block 302 and the first error estimating means 326. The PAPR reduction block 302 generates the output signal x^(n). the output signal x^(n) of the PAPR reduction block 302 is inputted to the HPA 306 and the second error estimating means 322 in the training mode and inputted to the PD 3004 in the linearization mode.

The mixter 312 and a first factor generator 314 that generate a signal relating a factor β that would be multiplied on the equivalent clipping noise signal $c^*_{CL}(n)$ may form a reduced clipping noise signal generator 312, 314. The reduced clipping noise signal generator 312, 314 generates a first reduced noise signal $\epsilon\epsilon^*_{CL}(n)$ using the factor β and the equivalent clipping noise signal $\epsilon^*_{CL}(n)$.

The PDs 304 (3002, 3004), 310 may distorts the PAPR reduced signal x^(n) and the first reduced noise signal x^(n)−β$\epsilon^*_{CL}(n)$ to generate a distorted signal z(n) and a distorted clipping noise signal Δε(n) by applying an approximated inverse (HPA−1) of an amplification function HPA on the PAPR reduced signal x^(n) and the first reduced noise signal $\epsilon^*_{CL}(n)$, respectively. The approximated inverse HPA−1 of an amplification function HPA may be defined by a polynomial with predistorter coefficients $a_k$ or $a_{k,q}$, as mentioned above. In the training mode the predistorter (PD) 304 has the unitary transfer function, i.e., the PD 304 may pass an input signal to its output signal without any modification, as illustrated in FIG. 8.

The HPA 306 may be also referred to as an amplifier that has a function of a signal amplification defined by the amplification function HPA which is applied on a sum of the distorted signal z(n) and the distorted clipping noise signal Δε(n) with a gain G to generate an output signal y(n).

The PDs 3002, 3004, 310 are modeled as a memoryless polynomial PD. The PDs 3002, 3004 are copies of the dummy PD 310 after function of the PDs is determined, for example the predistorter coefficients $a_k$ or $a_{k,q}$ are determined in the training mode of the system. The PD 3004 receives an input signal x^(n) and generates an output signal z(n):

$$z(n) = PD(\hat{x}(n)) \cdot \hat{x}(n) = a_0 \hat{x}(n) + a_1 \hat{x}(n) \cdot |\hat{x}(n)| + a_2 \hat{x}(n) \cdot |\hat{x}(n)|^2.$$

In the present embodiment, the polynomial order K is assumed to be 2. However, this case should be recognized as one of examples of the memoryless polynomial PD model, so that any other polynomial order can be accepted. Further, the memory effects can be handled by adopting a memory polynomial PD model in which the output signal z(n) can be expressed as:

$$z(n) = \sum_{q=1}^{Q} a_{0,q} x^{\wedge}(n-q) + \sum_{q=1}^{Q} a_{1,q} x^{\wedge}(n-q) \cdot |x^{\wedge}(n-q)| + \sum_{q=1}^{Q} a_{2,q} x^{\wedge}(n-q) \cdot |x^{\wedge}(n-q)|^2.$$

In dummy PD 310, the PD's coefficients $a_k$ or $a_{k,q}$ are determined by using the least square method in which an output signal y(n) of the HPA 306 and an error e(n) that is generated by the second error estimating means 322 are referenced, for example.

After the equivalent clipping noise signal $\epsilon^*_{CL}(n)$ is reduced by a factor α, a second reduced noise signal $\alpha\epsilon^*_{CL}(n)$ is added to the output signal z^(n) of the PD 310 at an adder 324. A signal relating to the factor α is generated at a second factor generator 320 and mixed with the equivalent clipping noise signal $\epsilon^*_{CL}(n)$ at a mixer 318. The adder 324 is provided between the PD 310 and the second error estimating mean 322. The weight generator 320, the second error estimating mean 322, and the adder 324 may compose a reference signal generator 320, 322, 324. The reference signal generator may generate a reference signal x^(n)−α$\epsilon^*_{CL}(n)$ that has a further reduced peak-to-average power level than the PAPR reduced signal x^(n) using the PAPR reduced signal x^(n) and the equivalent clipping noise signal $\epsilon^*_{CL}(n)$. The reference signal may be generated by a divided output signal y(n) which is obtained by dividing the output signal Gy(n) by the gain G as a reference signal at a divisor 326.

For example, the reference signal for training the PD 310 is $$\hat{z}(n) + \alpha\epsilon^*_{CL}(n) = \hat{x}(n) + \alpha\epsilon^*_{CL}(n)$$

when assuming that during the PD being in the training mode the PD 3004 has a unitary transfer function, i.e., z^(n)=x^(n). Because the output signal x^(n) from the PAPR reduction block 302 includes the second reduced noise signal $\epsilon_{CL}(n)$, that equals to $\epsilon^*_{CL}(n)$ in the training mode, the above equation can be written as:

$$\hat{x}(n) + \alpha\epsilon^*_{CL}(n) = x(n) + (\alpha+1)\epsilon^*_{CL}(n).$$

The second error estimating means 322 estimates an error e(n) defined as $$e(n) = y(n) - x(n) - (1+\alpha)\epsilon^*_{CL}(n).$$

Introducing new variables $u_k$:

$$u_k = (\hat{x}(n) + (1+\alpha)\epsilon^*_{CL}(n)) \cdot |\hat{x}(n)|^{k-1}$$

to estimate the PD's coefficients $a_k$ which minimize the error e(n), the relation between the output of the PD 204 z(n) and the output of the PD 208 z^(n) can be written in a matrix form:

$$Z^{\wedge} = U \cdot A,$$

$$Z^{\wedge} = [z^{\wedge}(0), z^{\wedge}(1), \ldots, z^{\wedge}(N-1)]^T,$$

$$U = \begin{bmatrix} u_1(0) & \cdots & u_K(0) \\ \vdots & \ddots & \vdots \\ u_1(N-1) & \cdots & u_K(N-1) \end{bmatrix},$$

$$A = [a_1, \ldots, a_K]^T.$$

The least square solution for the PD's coefficients $a_k$ may be:

$$A = (U^H \cdot U)^{-1} \cdot U^H \cdot Z,$$

where $(\ )^H$ denotes complex conjugate transpose. That is, the predistorter 304, 310 compares the reference signal x^(n)−α$\epsilon_{CL}(n)$ and the output signal y(n) to determine the predistorter coefficients $a_k$ or $a_{k,q}$.

In the above discussion, only the least square solution for the memoryless polynomial PD model is explicitly derived. However, least square solution for the memory polynomial PD model can be easily derived by the ordinary skilled person of the art.

The PD 3002 receives the equivalent clipping noise signal $\epsilon^*_{CL}(n)$ and generates a distorted noise $\Delta\epsilon(n)$:

$$\Delta\varepsilon(n) = a_0 \varepsilon^*_{CL}(n) + a_1 \varepsilon^*_{CL}(n) |x^{\wedge}(n)| + a_2 \varepsilon^*_{CL}(n) |x^{\wedge}(n)|^2$$

or $$\Delta\varepsilon(n) = \sum_{q=1}^{Q} a_{0,q} \varepsilon^*_{CL}(n) + \sum_{q=1}^{Q} a_{1,q} \varepsilon^*_{CL}(n) \cdot |x^{\wedge}(n-q)| + \sum_{q=1}^{Q} a_{2,q} \varepsilon^*_{CL}(n) \cdot |x^{\wedge}(n-q)|^2.$$

When the equivalent clipping noise signal $\epsilon^*_{CL}(n)$ is reduced by multiplying a factor β, the distorted noise $\Delta\epsilon(n)$ may be:

$$\Delta\varepsilon(n) = a_0 \beta \varepsilon^*_{CL}(n) + a_1 \beta \varepsilon^*_{CL}(n) |x^{\wedge}(n)| + a_2 \beta \varepsilon^*_{CL}(n) |x^{\wedge}(n)|^2$$

or $$\Delta\varepsilon(n) = \sum_{q=1}^{Q} a_{0,q} \beta \varepsilon^*_{CL}(n) + \sum_{q=1}^{Q} a_{1,q} \beta \varepsilon^*_{CL}(n) \cdot |x^{\wedge}(n-q)| + \sum_{q=1}^{Q} a_{2,q} \beta \varepsilon^*_{CL}(n) \cdot |x^{\wedge}(n-q)|^2.$$

A substracter 316 is provided to generate an input signal of the HPA 306 by subtracting the distorted clipping noise $\Delta\epsilon(n)$ from the output signal z(n) of the PD 3004:

$$z(n) - \Delta\varepsilon(n) = a_0((x^{\wedge}(n) - \varepsilon^*_{CL}(n)) - \beta\varepsilon^*_{CL}(n)) +$$
$$a_1((x^{\wedge}(n) - \varepsilon^*_{CL}(n)) - \beta\varepsilon^*_{CL}(n))|x^{\wedge}(n)| +$$
$$a_2((x^{\wedge}(n) - \varepsilon^*_{CL}(n)) - \beta\varepsilon^*_{CL}(n))|x^{\wedge}(n)|^2$$
$$= a_0(x^{\wedge}(n) - (1+\beta)\varepsilon^*_{CL}(n)) +$$
$$a_1(x^{\wedge}(n) - (1+\beta)\varepsilon^*_{CL}(n))|x^{\wedge}(n)| +$$
$$a_2(x^{\wedge}(n) - (1+\beta)\varepsilon^*_{CL}(n))|x^{\wedge}(n)|^2$$

for the memoryless polynomial PDs. The substracter 316 may also be constructed by a combination of an inverter and an adder. The expression in the memory polynomial PDs would be easily obtained by the ordinary skilled person of the art. Thus the clipping noise term $\epsilon^*_{CL}(n)$ has attenuation of factor $(1+\beta)$ with the appropriate selection for parameter $\beta$ ($0<-\beta<1$), and it is possible to get the additional attenuation for the clipping noise in the PDs.

Referring to FIGS. 8-9, the operation of the signal processing system (linearizer) 300 will be described. FIG. 8 is a functional diagram illustrating a linearizer 300 for signals with reduced PAPR that is operating in the training mode, and FIG. 9 is a functional diagram illustrating the linearizer 300 for signals with reduced PAPR in the linearization mode.

FIG. 8 illustrates an operation of the signal processing system 300 in the training mode. As illustrated in FIG. 8, in the training mode of the signal processing system (linearizer) 300, the PD's coefficients $a_k$ or $a_{k,q}$ are determined by using the least square method in which the total error $e(n)$ are minimized. Other method than the least square method can be applied to the determination of the PD's coefficients $a_k$ or $a_{k,q}$ such as a look-up-table method and etc.

In this mode, the peak-to-average ratio (PAPR) reducer 302 may reduce a peak-to-average ratio (PAPR) of an input signal $x(n)$ to generate a PAPR reduced signal $\hat{x}(n)$, wherein generation of a clipping noise signal $\epsilon_{CL}(n)$ is occurred in the PAPR reducer 302.

The clipping noise processing system 308 may split the clipping noise signal $\epsilon_{CL}(n)$ into an in-band clipping signal $\epsilon_{CL,IN}(n)$ and an out-of-band clipping signal $\epsilon_{CL,OUT}(n)$, and generate an equivalent clipping noise signal $\epsilon^*_{CL}(n)$ that is defined as a weighted sum of a weighted in-band clipping signal $W_{IN}*\epsilon_{CL,IN}(n)$ and a weighted out-of-band clipping signal $W_{OUT}*\epsilon_{CL,OUT}(n)$, wherein the weighted in-band clipping signal $W_{IN}*\epsilon_{CL,IN}(n)$ is generated by weighting the in-band clipping signal $\epsilon_{CL,IN}(n)$ with a first weight WIN, and the weighted out-of-band clipping signal $W_{OUT}*\epsilon_{CL,OUT}(n)$ is generated by weighting the out-of-band clipping signal $\epsilon_{CL,OUT}(n)$ with a second weight $W_{OUT}$.

The reduced clipping noise signal generator 312, 314 may be provided between the clipping noise processing system 308 and the PD 304 to generate a reduced noise signal $\beta\epsilon^*_{CL}(n)$. The reduced clipping noise signal generator 312, 314 may be constructed from a signal generator 312 and a mixer 314 that generate an output signal by multiplying input signals.

The predistorter (PD) 304, 310 may distort the PAPR reduced signal $\hat{x}(n)$ and the reduced noise signal $\beta\epsilon^*_{CL}(n)$ to generate a distorted signal $z(n)$ and a distorted clipping noise signal $\Delta\epsilon(n)$ by applying an approximated inverse HPA−1 of an amplification function HPA on the PAPR reduced signal $\hat{x}(n)$ and the reduced clipping noise signal $\hat{x}(n)-\beta\epsilon^*_{CL}(n)$, respectively, wherein the approximated inverse (HPA−1) of an amplification function HPA is defined by a polynomial with predistorter coefficients $a_k$ or $a_{k,q}$. It should be noted that, in the training mode the predistorter (PD) 304 has the unitary transfer function, i.e., the PD 304 may pass an input signal to its output without any modification.

The amplifier input signal generator 316 that generates a difference between the distorted signal $z(n)$ and the distorted clipping noise signal $\Delta\epsilon(n)$ as a high power amplifier (HPA) input signal $z(n)-\Delta\epsilon(n)$.

The amplifier (HPA) 306 that has a function of a signal amplification defined by the amplification function HPA which is applied on HPA input signal $z(n)-\Delta\epsilon(n)$ with a gain G to generate an output signal $y(n)$.

The reference signal generator 320, 322, 324 may generate a reference signal $\hat{x}(n)-\alpha\epsilon^*_{CL}(n)$ that has a further reduced peak-to-average power level than the PAPR reduced signal $\hat{x}(n)$ using the PAPR reduced signal $\hat{x}(n)$ and the equivalent clipping noise signal $\epsilon^*_{CL}(n)$ or using the output signal $y(n)$.

Further, the PD (the second PD) 310 compares the reference signal $\hat{x}(n)-\alpha\epsilon^*_{CL}(n)$ and the output signal $y(n)$ to determine the predistorter coefficients $a_k$ or $a_{k,q}$. This process may be performed in the training mode in which the first PD 304 has the unitary transfer function, that is, no distortion may be applied to the input signal in the first PD 304.

FIG. 9 illustrates an operation of the signal processing system 300 in the linearization mode. As illustrated in FIG. 9, in the linearization mode of the signal processing system (linearizer) 300, the out-of-band components of the input signal of the HPA 306 may be reduced because a high power amplifier (HPA) input signal $z(n)-\Delta\epsilon(n)=z(n)-HPA-1[\hat{x}(n)-\beta\epsilon^*_{CL}(n)]$ that has a reduced out-of-band components would be entered to the HPA 306.

In this mode, an input signal $x(n)$ may be processed in the PAPR reduction block in the similar way with the training mode.

The reduced clipping noise signal generator 312, 314 may generate a reduced noise signal $\beta\epsilon^*_{CL}(n)$ that has a further reduced peak-to-average power level using the equivalent clipping noise signal $\epsilon^*_{CL}(n)$.

The predistorter 304 may distort the PAPR reduced signal $\hat{x}(n)$ and the reduced noise signal $\beta\epsilon^*_{CL}(n)$ to generate a distorted signal $z(n)$ and a distorted clipping noise signal $\Delta\epsilon(n)$ by applying an approximated inverse HPA−1 of an amplification function HPA on the PAPR reduced signal $\hat{x}(n)$ and the reduced noise signal $\beta\epsilon^*_{CL}(n)$, respectively.

The amplifier input signal generator 316 that generates a difference between the distorted signal $z(n)$ and the distorted clipping noise signal $\Delta\epsilon(n)$ as a high power amplifier (HPA) input signal $z(n)-\Delta\epsilon(n)$.

The amplifier or a high power amplifier (HPA) 306 may amplify the high power amplifier (HPA) input signal $z(n)-\Delta\epsilon(n)$ with a gain G to generate an output signal $y(n)$.

The actual values selections for the parameters $W_{IN}$, $W_{OUT}$, $\alpha$ and $\beta$ may depend on the trade-off between error vector magnitude (EVM) of the output signal of the HPA 306, adjacent channel leakage ratio (ACLR), and intermidulation (IMD) distortion levels for signal of the output signal of the HPA 306. It is preferable the error vector magnitude, the levels of ACLR, the out-of-band emission, and the IMD distortion levels are as low as possible.

The EVM may be written as:

$$EMS = \sqrt{\frac{\langle P_N \rangle}{\langle P_S \rangle}}$$

where PN is channel noise power and PS is channel signal power, and <P> denotes to a root-mean-square power P. Noise consists of several components including noise generated by peak reduction process, in-band (in-channel) noise corresponding to linear distortion induced by frequency translation and amplification, in-band (in-channel) noise induced by the HPA 306. The power may be calculated by using the Fourier transform.

The adjacent channel leakage ratio (ACLR) may be defined as a ratio of adjacent channel leakage power PL to the channel signal power PS:

$$ACLR = \frac{P_L}{P_S}.$$

In the signal processing system, the clipping noise signal $\epsilon_{CL}(n)$ generated in the peak-to-average ratio deduction process may be split into the in-band clipping signal $\epsilon_{CL,IN}(n)$ and the out-of-band clipping signal $\epsilon_{CL,OUT}(n)$, and the in-band clipping signal $\epsilon_{CL,IN}(n)$ and the out-of-band clipping signal $\epsilon_{CL,OUT}(n)$ may be used in a training mode and a lizearation mode of the signal processing system Further, in the training mode of the signal processing system, total error term $\epsilon^*(n)+\epsilon_{CL}(n)$ may be minimized, where $\epsilon_{CL}(n)$ includes the clipping noise components and $\epsilon^*(n)$ includes the error components due to approximation solution for HPA inverse function HPA-1.

Figure 10:
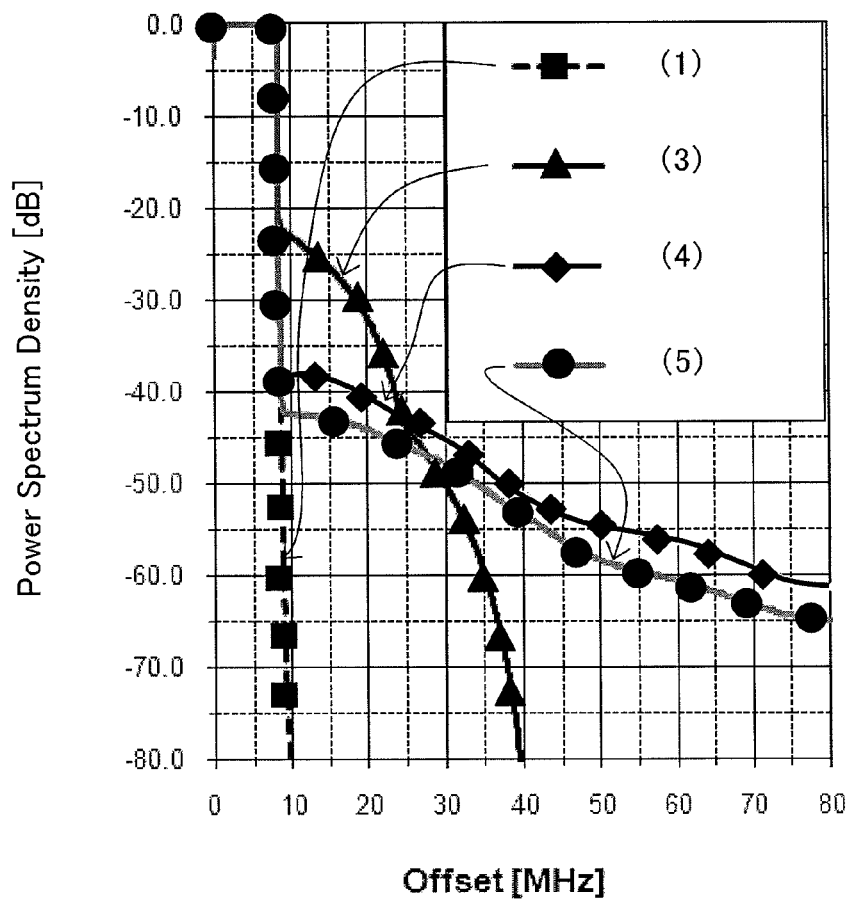
FIG. 10 is a diagram illustrating the exemplary spectrum of the original signal $x(n)$ (curve(1)), exemplary spectrum of an output signal of the HPA without any predistortion and treating memory effects (curve (3)), exemplary spectrum of an output signal of the signal processing system illustrated in FIG. 1, the output signal being obtained by performing recursive clip and filtering operation (curve (4)), and exemplary spectrum of an output signal of the signal processing system without treating memory effects, according to an embodiment of the present invention (curve (5))
Figure 11:
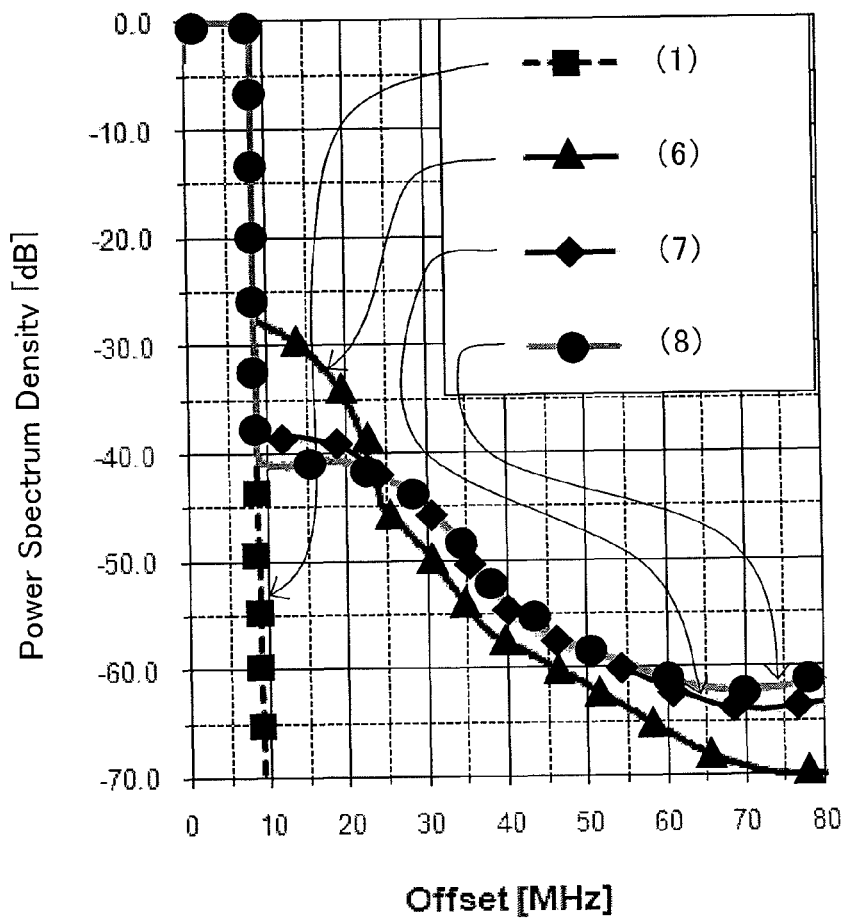
FIG. 11 is a diagram illustrating the exemplary spectrum of the original signal x(n) (curve(1)), exemplary spectrum of an output signal of the HPA treating without any predistortion and with treating the memory effects (curve (6)), exemplary spectrum of an output signal of the signal processing system illustrated in FIG. 1, the output signal being obtained by performing recursive clip and filtering operation (curve (7)), and exemplary spectrum of an output signal of the signal processing system with treating memory effects, according to an embodiment of the present invention (curve (8)).

Referring to FIGS. 10 and 11, the advantages of the signal processing system (linearizer) 300 for signals with reduced PAPR will be explained.

FIG. 10 is a diagram illustrating the exemplary spectrum of the original signal x(n) (curve(1)), exemplary spectrum of an output signal of the HPA without any predistortion and treating memory effects (curve (3)), exemplary spectrum of an output signal of the signal processing system illustrated in FIG. 1, the output signal being obtained by performing recursive clip and filtering operation (curve (4)), and exemplary spectrum of an output signal of the signal processing system without treating memory effects (curve (5)).

FIG. 11 is a diagram illustrating the exemplary spectrum of the original signal x(n) (curve(1)), exemplary spectrum of an output signal of the HPA treating without any predistortion and with treating the memory effects (curve (6)), exemplary spectrum of an output signal of the signal processing system illustrated in FIG. 1, the output signal being obtained by performing recursive clip and filtering operation (curve (7)), and exemplary spectrum of an output signal of the signal processing system with treating memory effects (curve (8)).

As can be seen in FIG. 10, the out-of-band spectrum of the output signal from the HPA 306 is reduced from that shown by the curve (4) to that shown by the curve (5) in the case where the PDs 3002, 3004, 310 are modeled by the memory-less polynomial PD model. It can be seen that power spectrum density is reduced by about 2-5 dB in the whole of the out-of-band frequency range, i.e., the frequency range beyond 10 MHz. Further, it can be also seen that the maximum value of the out-of-band spectrum does not exceed to the level of −40 dB in contrast to the case shown by the curve (4).

As can be seen in FIG. 11, the out-of-band spectrum of the output signal from the HPA 306 is reduced from that shown by the curve (7) to that shown by the curve (8) in the case where the PDs 3002, 3004, 310 are modeled by the memory polynomial PD model. It can be seen that power spectrum density is reduced in the whole of the out-of-band frequency range, i.e., the frequency range beyond 10 MHz. Further, it can be also seen that the maximum value of the out-of-band spectrum does not exceed to the level of −40 dB in contrast to the case shown by the curve (7).

Therefore, the signal processing system and the method can be provided for handling both of the clipping noise and the nonlinear signal distortions in the HPA output signal. Further it is preferable that the memory effects caused in the HPA may be handled. The signal processing system includes: a peak-to-average ratio (PAPR) reducer that reduces a peak-to-average ratio (PAPR) of an input signal x(n), a clipping noise processing system that generates an equivalent clipping noise signal $\epsilon^*_{CL}(n)$ that is defined as a weighted sum of a weighted in-band clipping signal $W_{IN}*\epsilon_{CL,IN}(n)$ and a weighted out-of-band clipping signal $W_{OUT}*\epsilon_{CL,OUT}(n)$ to be used for determining functions of a predistorter that suppresses out-of-band spectrum caused during peak-to-average power reduction process and for generating an input signal of an amplifier which input signal has reduced clipping noise and be distorted so as to compensate nonlinearity of the amplifier.

The signal processing system and the method can handle both of the clipping noise and the nonlinear signal distortions in the HPA output signal to reduce out-of-band noise.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A communication signal processing system, comprising:
   a peak-to-average ratio (PAPR) reducer that reduces a peak-to-average ratio (PAPR) of an input signal to generate a PAPR reduced signal, wherein generation of a clipping noise signal is occurred in the PAPR reducer;
   a clipping noise processing system that splits, in a time domain, the clipping noise signal into an in-band clipping signal and an out-of-band clipping signal, and generates an equivalent clipping noise signal that is defined as a weighted sum of a weighted in-band clipping signal and a weighted out-of-band clipping signal, wherein the weighted in-band clipping signal is generated by weighting the in-band clipping signal in a time domain with a first weight, and the weighted out-of-band clipping signal is generated by weighting the out-of-band clipping signal in time domain with a second weight;
   a reduced noise signal generator that generate a reduced clipping noise signal that has a further reduced peak-to-average power level using the equivalent clipping noise signal $\epsilon^*CL(n)$;
   a predistorter that distorts the PAPR reduced signal and the reduced clipping noise signal to generate a distorted signal and a distorted clipping noise signal by applying an approximated inverse of an amplification function on the PAPR reduced signal and the reduced clipping noise signal, respectively, wherein the approximated inverse of an amplification function is defined by a polynomial with predistorter coefficients;
   an amplifier input signal generator that generates a difference between the distorted signal and the distorted clipping noise signal as a high power amplifier (HPA) input signal;
   an amplifier that amplifies the high power amplifier (HPA) input signal with a gain G to generate an output signal; and
   a reference signal generator that generates a reference signal that has a further reduced peak-to-average power level than the PAPR reduced signal using the PAPR reduced signal and the equivalent clipping noise signal or using a divided output signal, wherein the predistorter compares the reference signal and the divided output signal to determine the predistorter coefficients.

2. The communication signal processing system according to claim 1, wherein
the first weight, and the second weight are adjusted to values that minimize an out-of-band component of the output signal.

3. The communication signal processing system according to claim 1, wherein
the first weight, and the second weight are adjusted to values that minimize an error vector magnitude of the output signal, the error vector magnitude of the output signal being defined as the square root of a ratio of a power of an out-of-band component of the output signal to a power of an in-band component of the output signal.

4. The communication signal processing system according to claim 1, wherein
the first weight and the second weight are adjusted to values that minimize a weighted sum of an error vector magnitude of the output signal and a power of an in-band component of the output signal, the error vector magnitude of the output signal being defined as a ratio of a power of an out-of-band component of the output signal to the power of the in-band component of the output signal.

5. A method for processing a communication signal, the method comprising:
reducing a peak-to-average ratio (PAPR) of an input signal to generate a PAPR reduced signal, wherein generation of a clipping noise signal is occurred during reducing the PAPR;
splitting, in a time domain, the clipping noise signal into an in-band clipping signal and an out-of-band clipping signal to generate an equivalent clipping noise signal that is defined as a weighted sum of a weighted in-band clipping signal and a weighted out-of-band clipping signal, wherein the weighted in-band clipping signal is generated by weighting the in-band clipping signal in a time domain with a first weight, and the weighted out-of-band clipping signal is generated by weighting the out-of-band clipping signal in a time domain with a second weight;
generating a reduced noise signal $\beta\epsilon^*CL(n)$ that has a further reduced peak-to-average power level using the equivalent clipping noise signal;
distorting the PAPR reduced signal and the reduced clipping noise signal to generate a distorted signal and a distorted clipping noise signal by applying an approximated inverse of an amplification function on the PAPR reduced signal and the reduced clipping noise signal, respectively, wherein the approximated inverse of an amplification function is defined by a polynomial with predistorter coefficients;
generating a difference between the distorted signal and the distorted clipping noise signal as a high power amplifier (HPA) input signal;
amplifying the high power amplifier input signal with a gain to generate an output signal with the amplification function;
generating a reference signal that has a further reduced peak-to-average power level than the PAPR reduced signal using the PAPR reduced signal and the equivalent clipping noise signal or using a divided output signal, and
comparing the reference signal and the divided output signal to determine the predistorter coefficients.

6. The method according to claim 5, wherein
the first weight, and the second weight are adjusted to values that minimize an out-of-band component of the output signal.

7. The method according to claim 5, wherein
the first weight, and the second weight are adjusted to values that minimize an error vector magnitude of the output signal, the error vector magnitude of the output signal being defined as the square root of a ratio of a power of an out-of-band component of the output signal to a power of an in-band component of the output signal.

8. The method according to claim 5, wherein
the first weight and the second weight are adjusted to values that minimize a weighted sum of an error vector magnitude of the output signal and a power of an in-band component of the output signal, the error vector magnitude of the output signal being defined as a ratio of a power of an out-of-band component of the output signal to the power of the in-band component of the output signal.

* * * * *